United States Patent [19]

Medeiros, III et al.

[11] Patent Number: 5,188,985
[45] Date of Patent: Feb. 23, 1993

[54] SURFACE MOUNT DEVICE WITH HIGH THERMAL CONDUCTIVITY

[75] Inventors: Manuel Medeiros, III, Acushnet; Jay S. Greenspan, South Dartmouth, both of Mass.

[73] Assignee: Aegis, Inc., New Bedford, Mass.

[21] Appl. No.: 871,446

[22] Filed: Apr. 21, 1992

Related U.S. Application Data

[62] Division of Ser. No. 677,078, Mar. 29, 1981, Pat. No. 5,111,277.

[51] Int. Cl.$^5$ .............................................. H01L 21/60
[52] U.S. Cl. .................... 437/218; 437/209; 437/215; 257/207; 257/711; 257/693
[58] Field of Search ................... 437/218, 209, 215; 357/70, 74, 80

[56] References Cited

U.S. PATENT DOCUMENTS

| | | |
|---|---|---|
| 3,685,134 | 8/1972 | Blue. |
| 4,025,997 | 5/1977 | Gernitis et al.. |
| 4,172,261 | 10/1979 | Tsuzuki et al. ........................ 357/74 |
| 4,427,993 | 1/1984 | Fichot et al.. |
| 4,483,067 | 11/1984 | Parmentier .......................... 437/209 |
| 4,611,882 | 9/1986 | Ushida .................................. 357/80 |
| 4,680,618 | 7/1987 | Kurodu et al. ........................ 357/74 |
| 4,800,459 | 1/1989 | Takagi et al.. |
| 4,811,893 | 3/1989 | Kanahara et al.. |
| 4,827,082 | 5/1989 | Horiuchi et al.. |
| 4,943,844 | 7/1990 | Oscilowski et al.. |
| 5,041,395 | 8/1991 | Steffen .................................. 357/72 |
| 5,063,177 | 11/1991 | Geller et al. ........................ 437/209 |

OTHER PUBLICATIONS

Metals Handbook®, Ninth Edition, vol. 7, Powder Metallurgy, American Society for Metals, Metals Park, Ohio 44073, Jun. 1984, pp. 551-566.
Shinko Electric, Power Transistor Ceramic Package, LCC-3 Series Ceramic Packages having Tungsten-Copper Plates on Both Sides of Base, Metallized Tungsten Thermal Vias Interconnect the Plates.

*Primary Examiner*—Brian E. Hearn
*Assistant Examiner*—Kevin M. Picardat
*Attorney, Agent, or Firm*—Gregory S. Rosenblatt; Paul Weinstein

[57] ABSTRACT

A surface mount package for encapsulating an electronic device is provided. The package has a ceramic frame containing a plurality of apertures. Copper-tungsten composite metallic components are bonded to the ceramic frame and individually extend across each of the apertures. The metallic components may include a flange for bonding and a pedestal extending into each aperture.

12 Claims, 2 Drawing Sheets

SURFACE MOUNT DEVICE WITH HIGH THERMAL CONDUCTIVITY

This application is a division of application Ser. No. 07/677,078, filed Mar. 29, 1991 now U.S. Pat. No. 5,111,277.

BACKGROUND OF THE INVENTION

1. Field of the Invention.

This invention relates generally to a package for housing an electronic circuit. More particularly, the invention relates to a surface mount package having a composite metal base supported by a ceramic frame.

2. Description of Related Art

Increasingly complex microelectronic circuits such as silicon semiconductor integrated circuits and hybrid microelectronic circuits require packages which both encase the circuits and provide electrical interconnection to external circuitry. One suitable package is a surface mount package ("SMT"). The SMT substrate is formed from a plurality of ceramic layers. Each ceramic layer has certain designated functions. For example, a portion of a first ceramic layer may be metallized to permit soldering of an electronic device. A second layer may have metallized circuit traces for wire bonding. Another ceramic layer may be glass sealed to a lid encasing the chip in a hermetic package. Of course, any or all layers may be for a multiplicity of functions. Metallization extending from the circuit traces are soldered to contacts on a circuit board electrically interconnecting the package to the board.

A surface mount package is favored where a low profile package is required or the space available to mount the package is limited. As electronic devices become more complex and available space is reduced, the desirability of a surface mount package increases. Concurrently, as the device complexity increases, the heat generated by operation increases. If the heat is not removed, the temperature of the device rises shortening the operational life. It is therefore highly desirable to develop surface mount packages having high thermal conductivity.

Most ceramic surface mount packages have an alumina ($Al_2O_3$) base. Alumina is selected because its coefficient of thermal expansion is close to that of silicon integrated circuits and alumina hybrid circuits. Prefired alumina (green tape) is easy to stamp or otherwise shape into a desired design. After firing, a dense chemically resistant substrate is formed. $Al_2O_3$ is a poor conductor of heat, having a thermal conductivity ($T_c$) of 20 W/m-K. By comparison, copper has a $T_c$ of 393.7 W/m-K.

To improve the thermal conduction of heat from the integrated circuit device, U.S. Pat. No. 4,827,082 by Horiuchi et al discloses the use of a ceramic base having better thermal conductivity than alumina. Rather than forming the base of the package from $Al_2O_3$, AlN or SiC having a thermal conductivity in excess of 140 W/m-K are chosen for the base. The device is mounted directly to the AlN or SiC base resulting in an eight fold improvement in thermal conductivity. Aluminum nitride and silicon carbide are more expensive than alumina and more difficult to shape. Care must be take during firing to prevent oxidation of aluminum nitride back to $Al_2O_3$.

Another solution is disclosed in U.S. Pat. No. 4,025,997 to Gernitis et al. A metallic heat sink is soldered an alumina substrate opposite the integrated circuit device. To prevent fracture of the substrate due to coefficient of thermal expansion mismatch, the heat sink is selected to be a composite material having high thermal conductivity and a relatively low coefficient of thermal expansion. Disclosed substrates include molybdenum clad copper and copper clad molybdenum. Proper selection of cladding thickness adjusts the coefficient of thermal expansion to a desired quantity. A disadvantage with this approach is that an insulative alumina layer is disposed between the integrated circuit device and the heat sink. The removal of heat from the chip is limited by the conduction of heat through the alumina layer.

An approach disclosed in a Shinko Electric publication entitled "Power Transistor Ceramic Package, LCC-3 Series" has the ceramic base sandwiched between two thin tungsten-copper plates. An integrated circuit device is mounted on an interior plate and tungsten vias interconnect the two plates to conduct heat from the device. Thermal conductivity is limited by the tungsten, $T_c = 166.1$ W/m-K, and the cross-sectional area of the vias. The tungsten vias appear to occupy about 20-25% of the cross-sectional area between the two copper-tungsten plates.

Another approach is disclosed in U.S. Pat. No. 4,680,618 to Kuroda et al. A porous molybdenum or tungsten base is infiltrated with molten copper. The infiltrated base is then soldered to a ceramic frame. An electronic device is bonded directly to the infiltrated molybdenum or tungsten base. A thermal conductivity of up to 293 W/m-K is theoretically possible with this type of package.

An infiltrated base has limitations. All pores in the skeleton must be filled with the molten copper. Any air gaps reduce thermal conductivity. When the concentration of the tungsten is high, above about 65% by volume (80% by weight), the infiltrated composite becomes difficult to shape by forging or other deformation processes. Machining is required, necessitating piece by piece manufacture and the generation of scrap increasing the cost of the composite.

SUMMARY OF THE INVENTION

Accordingly, it is an object of the invention to provide a ceramic surface mount package which does not have the disadvantages of the prior art. It is a feature of the invention that in one embodiment the package has a ceramic frame and a pressed powder copper-tungsten base. The base is preferably brazed to the frame. Another feature of the invention is that both the integrated circuit device and the bond wires are attached directly to the composite material. Yet another feature of the invention is that the package may be sealed by seam welding a metallic lid.

Advantages of the surface mount package of the invention include improved thermal conductivity and better electrical properties in the form of lower resistance than provided by the prior art. Another advantage of the SMT of the invention is that electrically conductive vias may be recessed below the body of the ceramic frame to minimize the electrical short circuits. Yet another advantage is that the package may be sealed by seam welding minimizing exposure of the device to elevated temperatures.

In accordance with the invention, there is provided a package for use in encapsulating an electronic device. The package includes a ceramic frame having first and second sides and a plurality of apertures. A plurality of metallic components are bonded to the frame. A separate metallic component extends across each of the apertures.

BRIEF DESCRIPTION OF THE DRAWINGS

The above-stated objects, features and advantages, as well as others, will become apparent from the specification and drawings which follow.

DETAILED DESCRIPTION

Figure 1:
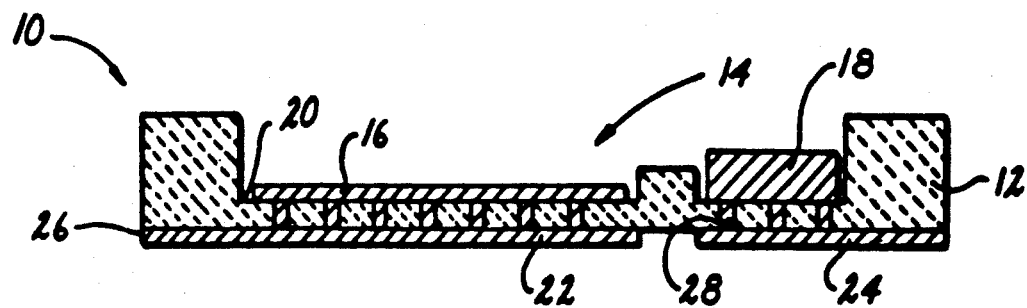
FIG. 1 shows in cross-sectional representation a ceramic surface mount package as known from the prior art.

FIG. 1 shows in cross-sectional representation a ceramic surface mount package 10 as known from the prior art. The package 10 has a ceramic body 12 defining a cavity 14 for housing an integrated circuit device. A first metallic plate 16 and second metallic plate 18 are bonded to an interior surface 20 of the ceramic body 12. Both the first 16 and second 18 metallic plates are formed from copper-tungsten. The cavity 14 has a limited depth, so the thickness of the first metallic plate 16 is limited to about 10 mils, while the second metallic plate 18 is about 30 mils thick.

A third metallic plate 22 and fourth metallic plate 24 are bonded to an exterior surface 26 of the ceramic body 12 opposite the first 16 and second 18 metallic plates to provide electrical connection to external circuitry. The third 22 and fourth 24 metallic plates are formed from copper-tungsten and have a thickness of about 10 mils.

Metallized vias 28 conduct heat and electrical impulses from the first 16 and second 18 metallic plates to the third 22 and fourth 24 metallic plates. The vias are formed from a fired tungsten paste.

The thermal and electrical limitations of the prior art SMT package 10 originate with the metallized vias 28. The vias 28 occupy a limited area between metallic plates. The remainder of the area is thermally and electrically insulating $Al_2O_3$. Both the thermal conductivity and electrical conductivity are limited by the cross-sectional dimension of the metallized vias 28.

Figure 2:
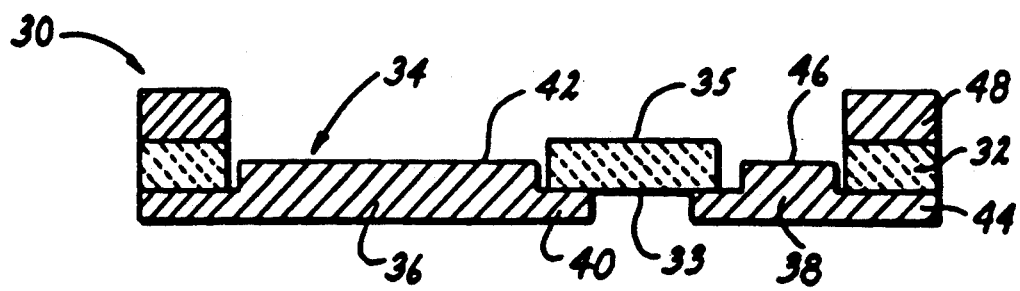
FIG. 2 shows in cross-sectional representation a ceramic surface mount package containing a plurality of apertures sealed with a composite material in accordance with the invention.

FIG. 2 shows in cross-sectional representation a surface mount package 30 which does not suffer the limitations of the prior art package. The surface mount package 30 has a ceramic frame 32. The ceramic frame has a first, exterior facing, side 33 and a second, interior facing, side 35. Extending through the ceramic frame 32 are a plurality of apertures 34. The plurality of apertures 34 are sealed by separate metallic components 36, 38 which each extend across an aperture 34 sealing one end.

The ceramic frame 32 is manufactured from a suitable ceramic which is thermally stable at elevated temperatures, chemically resistant and resistant to gas diffusion. A preferred ceramic is alumina ($Al_2O_3$). Other suitable ceramics such as aluminum nitride and silicon carbide may be used. The ceramic may include a various fillers to influence its properties. For example, a pigment may be added to impart the ceramic with a desired coloration. One preferred color is black for cosmetic reasons or to improve infrared absorption to assist soldering.

The first 36 and second 38 metallic components are formed from a material having good thermal conductivity and a coefficient of thermal expansion close to that of the ceramic frame 32. While low expansion metals such as molybdenum and iron nickel alloys such as alloy 42 (42% nickel, remainder iron) meet these requirements, more preferred are composite materials having high thermal and electrical conductivity. The preferred materials include composites having a molybdenum or tungsten matrix and a high thermal conductivity, high electrical conductivity second phase. The second phase may be copper, silver, a copper alloy or a silver alloy. Most preferred is a composite of copper and tungsten. To match the coefficient of thermal expansion of the alumina substrate, the concentration of copper is preferably between about 5% and about 25% by weight. More preferably, the copper concentration is between about 10% and about 20% and most preferably from about 12% to about 16%.

The composite may be formed by any suitable process such as infiltration of a tungsten skeleton by molten copper or by powder metallurgy. To facilitate shaping of the metallic components, powder metallurgy is preferred.

The first metallic component 36 and second metallic component 38 may be a plate extending across the apertures 34. Preferably, both the first 36 and second 38 metallic components are shaped to include a flange 40 and a pedestal 42. The flange 40 is bonded to one side of the ceramic frame 32 by soldering, brazing or other means of adhesion. The pedestal 42 extends into the aperture 34 to receive an integrated circuit device. The second metallic component 38 contains a flange 44 and pedestal 46. The flange 44 is for bonding to the ceramic frame 32 and the pedestal 46 is for receiving wire bonds.

The surface mount package 30 is sealed by soldering or glass sealing a lid to the ceramic frame 32 opposite the metallic components. Preferably, a seal ring 48 manufactured from a low expansion metal such as Kovar (nominal composition by weight 53% Fe, 17% Co and 29% Ni) is brazed to the ceramic frame 32. The metallic seal ring 48 facilitates seam welding of a metallic lid. Seam welding is preferred over soldering or glass sealing because the sealing energy is concentrated at the interface of the lid and the seal ring 48. It is not necessary to elevate the entire package to the sealing temperature, typically in excess of 300° C. The microelectronic device is not subjected to elevated temperatures and sealing does not require a controlled atmosphere.

Figure 3:
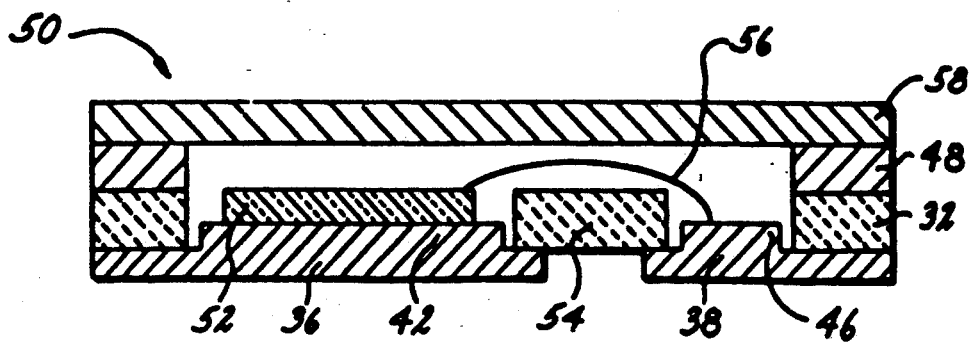
FIG. 3 shows in cross-sectional representation the surface mount package of the invention having a seam welded metallic lid.

FIG. 3 shows in cross-sectional representation a completed SMT package 50. An integrated circuit device 52 is bonded to the pedestal 42 of the first metallic component 36. The coefficient of thermal expansion of the first metallic component 36 is approximately equal to that of the alumina or silicon based integrated circuit 52, so any conventional die attach material may be used. Preferred die attach materials are eutectic gold solders such as gold tin and gold silicon.

The preferred composite metal having a copper concentration of about 15% and the remainder tungsten, has a thermal conductivity of about 167 W/m.K and an electrical conductivity of about 35% IACS. There is no interposing alumina to isolate the chip from the metallic heat sink. The entire chip is in contact with the heat sink improving thermal transfer.

The second metallic component 38 preferably includes pedestal 46 which does not extend above the surface of the ceramic frame 32. The central portion 54 of the ceramic frame is higher than either pedestal 42 or pedestal 46. A bond wire 56 electrically interconnects the integrated circuit device 52 with the second metallic component 38. The bond wire 56 is typically manufactured from copper or aluminum and has a thickness of about 0.015 inches. The thin bond wire 56 is subject to distortion and wire bond sag as a result of the package being exposed to heat or acceleration. Forming the central portion 54 of the ceramic frame 32 to be the highest portion within the SMT package 50 insures that if the bond wire 56 sags or moves, the wire will contact the central portion 54 rather than a metallic component. Wire sag or wire movement will not result in an electrical short circuit.

Subsequent to die attach and wire bonding, the SMT package 50 is sealed with a metallic cover 58. The metallic cover 58 is preferably Kovar or another metal having a coefficient of thermal expansion approximately equal to that of the ceramic frame 32. The metallic cover 58 is bonded to seal ring 48 by a process such as seam welding. In seam welding, arc or resistance welding produces a series of overlapping spot welds which form a continuous, hermetic seal.

The assembled package is then soldered to a printed circuit board or other external circuitry such that exterior surfaces of the first 36 and second 38 metallic components are bonded to and electrically interconnected to the external circuitry.

Figure 4A:
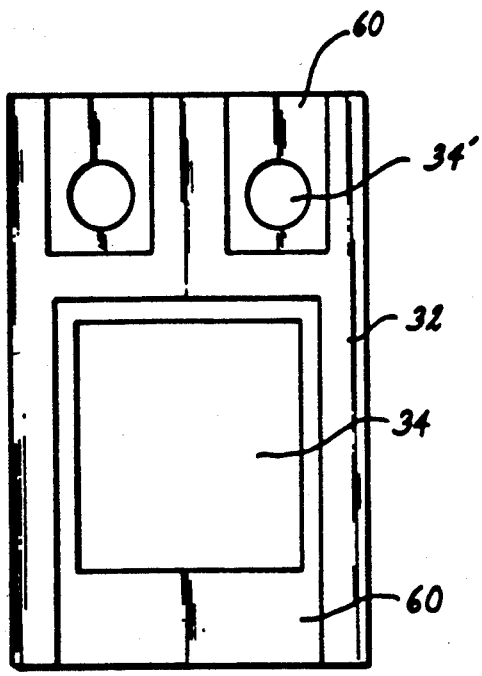
FIGS. 4A and 4B show in bottom planar view and top planar view, respectively, a ceramic frame and metallization used in the assembly of the surface mount package of the invention.
Figure 4B:
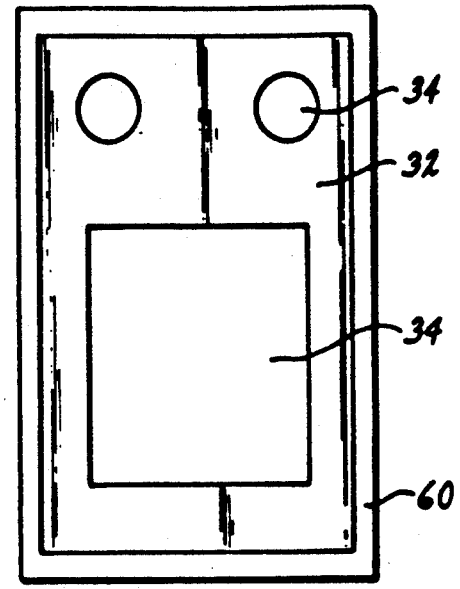

FIGS. 4A and 4B show the assembly of the SMT package of the invention. FIG. 4A shows an intermediate assembly step in bottom planar view while FIG. 4B shows the same intermediate assembly step in top planar view. An alumina substrate is provided with apertures 34, 34' by laser drilling. A CO$_2$ laser cuts the apertures to form ceramic frame 32. The ceramic frame 32 is selectively metallized with tungsten paste 60. The tungsten paste 60 is applied on the backside of the ceramic frame as illustrated in FIG. 4A to define the bonding locations of the first metallic component which extends across aperture 34 and at least one second metallic component extending across aperture 34'. Either simultaneously or as a sequential operation, tungsten metallization is applied to the front side of the ceramic frame 32 as illustrated in FIG. 4B for bonding the seal ring. The tungsten metallization is generally applied by a screen printing operation which provides an accurate deposition of a controlled thickness of tungsten. The tungsten paste is preferably screened to a thickness which will produce a post firing thickness of from about 1000 to about 3000 microinches. Metallizations other than tungsten, such as moly manganese may also be utilized.

The ceramic frame 32 is then fired at an elevated temperature of about 1400° C. to fire the tungsten paste. Firing converts the tungsten paste into tungsten metal and binds the tungsten to the ceramic substrate.

The fired tungsten paste is nickel plated in an electrolytic bath to a thickness of from about 50 to 150 microinches. To improve adhesion of the nickel to the tungsten, the plated substrate may be sintered by heating to a temperature of about 600° C. in a reducing atmosphere.

The metallic components are a mixture of copper and tungsten. It is preferred to deposit a layer of nickel on the metallic components. However, adhesion of nickel to the tungsten is not satisfactory due to residual refractory oxides. Using a preplate activation process sufficiently aggressive to remove refractory oxides attacks the copper constituent of the component producing an uneven surface. Applicants have discovered that the deposition of a flash (about 10 to 25 micro inches) of gold deposited from an electrolytic bath can be deposited on the composite. Once the gold flash is deposited, nickel of a desired thickness, about 50 to about 150 micro inches, may be deposited on the gold by standard electrolytic deposition. The metallic components are then ready for brazing to the ceramic frame.

The Kovar seal ring is preferably coated with from about 50 to 150 microinches of nickel prior to brazing. Once the metallization on the ceramic frame 32, the metallic components and the seal ring are nickel plated, the assembly is bonded. Any suitable adhesion technique may be used. Brazing with the copper/silver eutectic referred to as BT (nominal composition 72% copper/28% silver) is preferred. The braze, either as a paste or preform is disposed between the metallized surfaces 60 of the ceramic frame 32 and the flanges of the first and second metallic components and the seal ring. The metallic components are positioned so the pedestals extend into the apertures 34, 34'. Alignment is maintained using a fixture such as a graphite boat. The assembly is brazed by heating to a temperature of about 780° C. in hydrogen. The SMT package is then essentially as shown by reference numeral 30 in FIG. 2.

Figure 5A:
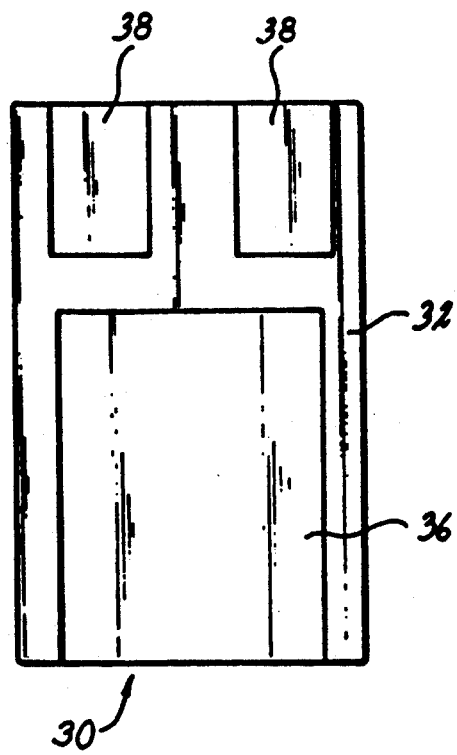
FIGS. 5A and 5B show in bottom planar view and top planar view, respectively, the surface mount package of the invention subsequent to brazing a chip attach pad, electrically conductive vias and seal ring.
Figure 5B:
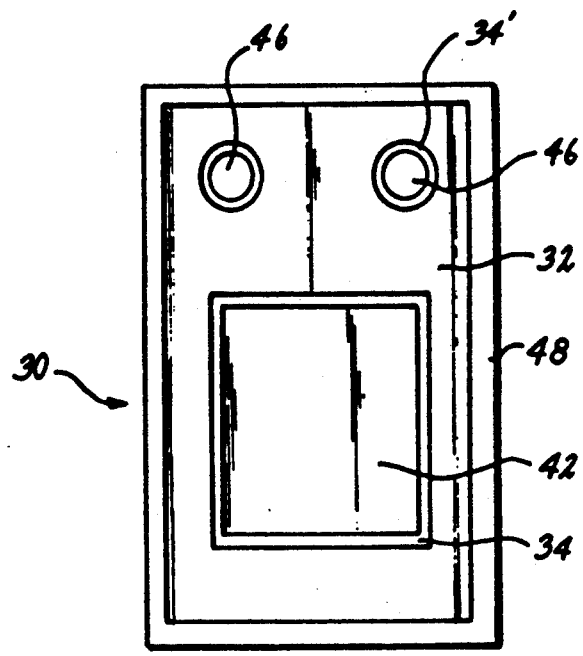

The brazed assembly is illustrated in bottom planar view in FIG. 5A and top planar view in FIG. 5B. With reference to FIG. 5A, brazed to the ceramic frame 32 are the first metallic component 36 and one or more second metallic components 38. With reference to the top planar view in FIG. 5B, the seal ring 48 is brazed to the perimeter of the ceramic frame 32. The first pedestal 42 extends into the aperture 34 for receiving an integrated circuit device. One or more second pedestals 46 extend into the apertures 34' to receive the bond wires. To facilitate die attach and soldering, the assembly 30 may be gold plated with from about 30 to about 60 microinches of gold. To prevent diffusion of the gold into the BT braze or metallic components and seal ring, it is preferably to deposit from about 50 to about 150 microinches of nickel by an electroless process onto all metallized surfaces of the assembly prior to gold plating. After gold plating, the chip is attached and wire bonded. The lid is then sealed to the seal ring completing the SMT package.

Any suitable assembly process may be employed. Rather than beginning with a fired ceramic sheet in which the holes are formed by laser drilling, ceramic powder may be pressed into a mold having the desired shape including the apertures. The powder can be injection molded to precise dimensions. The powder is pressed into a loose compact which has sufficient integrity for tungsten metallization. The compact and metallization are fired by heating to a temperature of about 1550° C. The metallized ceramic frame is then further processed as above.

While the metallic components have been illustrated as bonded to the exterior facing surface of the ceramic frame, it is within the scope of the invention to bond some or all the metallic components to the interior facing surface of the ceramic frame. The pedestals then extend through the apertures and outwardly from the package. This configuration is particularly suited for pin grid array and pad array packages.

While the package and assembly process have been described in terms of a surface mount package, other ceramic packages such as leadless chip carriers, cerdips or cerquads are also applicable. Ceramic pin grid array packages are particularly suited for a ceramic substrate having a plurality of metallic contact pads on an exterior surface extending into apertures on an inside surface.

The patents and publications set forth in the application are intended to be incorporated herein by reference.

It is apparent that there has been provided in accordance with this invention a surface mount package having improved thermal and electrical properties which fully satisfies the objects, means and advantages set forth herein before. While the invention has been described in combination with specific embodiments and examples thereof, it is evident that many alternatives, modifications and variations will be apparent to those o skilled in the art in light of the foregoing description. Accordingly, it is intended to embrace all such alternatives, modifications and variations as fall within the spirit and broad scope of the appended claims.

We claim:

1. A process for the manufacture of a package for encapsulating an electronic device, comprising:
   (a). forming a plurality of apertures in a ceramic substrate;
   (b). depositing a metallization layer on a first surface of said ceramic substrate about the perimeter of each of said apertures; and
   (c). sealing each of said apertures by bonding a separate metallic component having a coefficient of thermal expansion approximately equal to that of said electronic device to said metallization layer about each of said apertures.

2. The process of claim 1 wherein said apertures are formed by laser drilling an alumina substrate.

3. The process of claim 1 wherein said apertures are formed by compacting alumina powder into a mold of the desired configuration.

4. The process of claim 1 wherein said metallization is deposited as a tungsten paste which is fired to form tungsten metal.

5. The process of claim 4 including compacting a mixture of tungsten and copper powders to form said metallic component, said metallic component having a flange and a pedestal.

6. The process of claim 5 wherein said mixture comprises from about 10% to about 20% copper and the balance tungsten.

7. The process of claim 6 wherein both said tungsten metallization and said metallic component are plated with from about 50 to about 150 microinches of nickel.

8. The process of claim 7 wherein a layer of gold is disposed between said metallic component and said nickel.

9. The process of claim 8 wherein said step of bonding said metallic component to said metallization layer comprises brazing.

10. The process of claim 9 wherein the perimeter of said second side of said ceramic substrate is metallized and fired prior to brazing and a seal ring is brazed to said second side metallization.

11. The process of claim 10 wherein said seal ring comprises a Kovar ring coated with from about 50 to about 150 microinches of nickel.

12. The process of claim 11 wherein an integrated circuit device is bonded to a first pedestal and electrically interconnected to at least one other of said pedestals and a cover component is welded to said seal ring.

* * * * *